(12) United States Patent
Usuki et al.

(10) Patent No.: US 6,195,292 B1
(45) Date of Patent: Feb. 27, 2001

(54) SEMICONDUCTOR MEMORY WITH FLOATING GATE TYPE FET

(75) Inventors: Tatsuya Usuki; Toshiro Futatsugi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/437,142

(22) Filed: Nov. 10, 1999

(30) Foreign Application Priority Data

Nov. 12, 1998 (JP) .................................................. 10-322034

(51) Int. Cl.⁷ .................................................... G11C 16/04
(52) U.S. Cl. ............................... 365/185.28; 365/185.01; 365/185.26
(58) Field of Search ......................... 365/185.28, 185.26, 365/185.01

(56) References Cited

U.S. PATENT DOCUMENTS

| | | | |
|---|---|---|---|
| 5,508,543 | * 4/1996 | Hartstein et al. | 257/314 |
| 5,901,084 | * 5/1999 | Ohnakado | 365/185.18 |
| 5,932,889 | * 8/1999 | Matsumura et al. | 257/14 |

FOREIGN PATENT DOCUMENTS 7-302848    11/1995 (JP) .
10-135357    5/1998 (JP) .

* cited by examiner

*Primary Examiner*—David Nelms
*Assistant Examiner*—Thong Le
(74) *Attorney, Agent, or Firm*—Armstrong, Westerman, Hattori, McLeland & Naughton

(57) ABSTRACT

A source region and a drain region are formed in a surface layer of a semiconductor substrate on both sides of a channel region defined in the surface layer. A tunneling insulating film is formed on the channel region, the tunneling insulating film having a thickness which allows carriers to tunnel therethrough. A floating gate electrode is formed on the tunneling insulating film, the floating gate electrode being disposed so as to overlap neither the source region nor the drain region as viewed along a substrate normal direction. A gate insulating film is formed over the channel region, covering the floating gate electrode. A control gate electrode is formed on the gate insulating film, the control gate electrode being disposed so as to become in contact with, or partially overlap, the source and drain regions as viewed along the substrate normal direction. Materials of the floating gate electrode and channel region are selected so that a Fermi level of the floating gate electrode is positioned in an energy band gap of the channel region when an external voltage is not applied between the channel region and the control gate electrode.

13 Claims, 7 Drawing Sheets

SEMICONDUCTOR MEMORY WITH FLOATING GATE TYPE FET

This application is based on Japanese Patent Application No. HEI 10-322034 filed on Nov. 12, 1998, the entire contents of which are incorporated herein by reference.

BACKGROUND OF THE INVENTION a) Field of the Invention

The present invention relates to a semiconductor memory based upon a new operation principle. Dynamic random access memories (DRAMs) are known as typical semiconductor memories. One bit data is stored in one memory cell of DRAM which is constituted of one MISFET and one capacitor. DRAMs having ultra fine memory cells and a high capacity are under development. Semiconductor memories capable of realizing a still larger capacity are still desired.

b) Description of the Related Art

A flash memory has drawn attention as semiconductor memories capable of realizing a larger capacity. The flash memory is suitable for realizing a larger capacity because one memory cell is constituted by only one MISFET.

Data is stored in a flash memory by injecting carriers into a floating gate electrode of a floating gate type FET. In order to retain carriers injected into the floating gate electrode, the thickness of an insulating film between the floating gate electrode and the channel region is set to about 8 nm. Carriers are injected via this insulating film into the floating gate electrode by applying a high voltage across the channel region and floating gate electrode. As a high voltage is applied between them, carriers are injected into the floating gate electrode by the Fowler-Nordheim tunneling (FN tunneling) phenomenon.

A voltage of about 10 to 20 V is required in order to inject carriers into the floating gate electrode by the FN tunneling phenomenon. It is therefore difficult to lower the voltage and reduce power consumption.

SUMMARY OF THE INVENTION

It is an object of the present invention to provide a semiconductor memory capable of realizing a large capacity and a low voltage.

According to one aspect of the present invention, there is provided a semiconductor memory comprising: a semiconductor substrate; a source region and a drain region formed in a surface layer of the semiconductor substrate on both sides of a channel region defined in the surface layer, the source and drain regions being of a first conductivity type; a tunneling insulating film formed on the channel region of the semiconductor substrate, the tunneling insulating film having a thickness which allows carriers to tunnel therethrough by a tunneling phenomenon; a floating gate electrode formed on the tunneling insulating film, the floating gate electrode being disposed so as to overlap neither the source region nor the drain region as viewed along a substrate normal direction; a gate insulating film formed over the channel region and covering the floating gate electrode; and a control gate electrode formed on the gate insulating film, the control gate electrode being disposed so as to become in contact with, or partially overlap, the source and drain regions as viewed along the substrate normal direction, wherein materials of the floating gate electrode and the channel region are selected so that a Fermi level of the floating gate electrode is positioned in an energy band gap of the channel region when an external voltage is not applied between the channel region and the control gate electrode.

As a voltage is applied between the control gate electrode and the source/drain regions, carriers in the channel region are tunneled through the tunnel insulating film and injected into the floating gate electrode. The carriers injected into the floating gate electrode have an energy level near the Fermi level of the floating gate electrode. Since the Fermi level of the floating gate electrode is positioned in the energy band gap of the channel region, the injected electrons cannot enter the channel region by the tunneling phenomenon. Electrons can therefore be retained in the floating gate electrode for a long time.

Since not the FN tunneling phenomenon but the direct tunneling phenomenon is used, data can be written and erased by using relatively low voltages. Since one memory cell is constituted of one floating gate type FET, high integration of memory cells is possible.

DETAILED DESCRIPTION OF THE PREFERRED EMBODIMENTS

Figure 1:
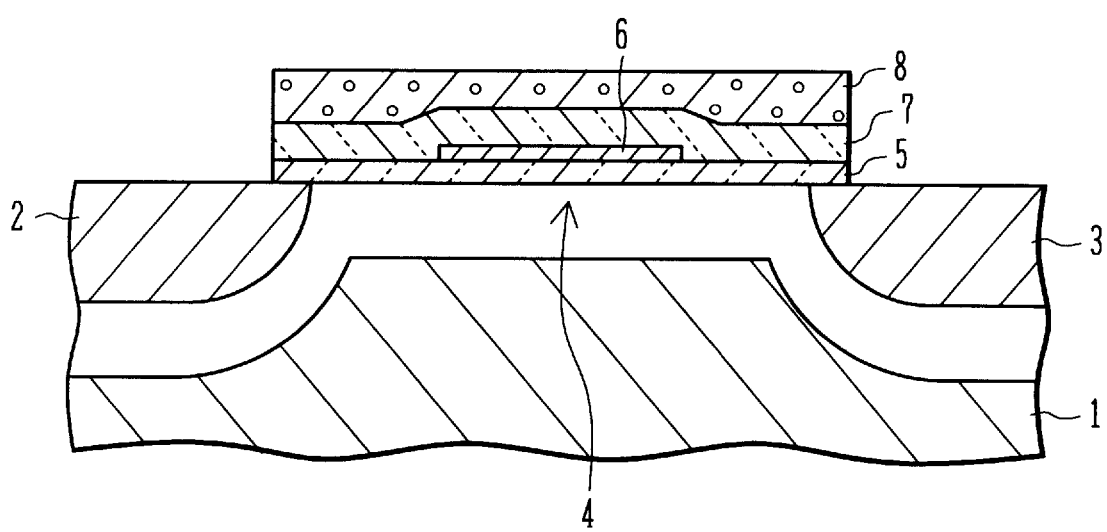
FIG. 1 is a cross sectional view of one memory cell of a semiconductor memory according to a first embodiment of the invention.

FIG. 1 is a cross sectional view of one memory cell of a semiconductor memory according to the first embodiment of the invention.

In a surface layer of a pR-type silicon substrate 1, an n-type source region 2 and an n-type drain region 3 are formed on both sides of a channel region 4. The impurity concentration of the p-type silicon substrate is, for example, $5 \times 10^{15}$ cm$^{-3}$. The channel length, i.e., a distance between the source and drain regions 2 and 3, is 150 nm for example. A tunneling insulating film 5 made of $SiO_2$ and having a thickness of 2 to 3 nm is formed on the surface of the channel region 4. The thickness of the tunneling insulating film 5 is set so that carriers can tunnel therethrough by the tunneling phenomenon.

On the surface of the tunneling insulating film 5, a floating gate electrode 6 having a thickness of 10 nm is formed. The floating gate electrode 6 is made of refractory metal such as TiN. The floating gate electrode 6 is disposed so as to overlap neither the source region 2 nor the drain region 3, as viewed along the substrate normal direction. For example, the distance between the edge of the floating gate electrode 6 on the side of the source region 2 and the edge of the source region 2 on the side of the channel region 4, and the distance between the edge of the floating gate electrode 6 on the side of the drain region 3 and the edge of the drain region 3 on the side of the channel region 4, are both set to 50 nm.

A gate insulating film 7 made of $SiO_2$ and having a thickness of 6 to 10 nm is formed covering the tunneling insulating film 5 and floating gate electrode 6. On the surface of the gate insulating film 7, a control gate electrode 8 made of $n^+$-type polysilicon is formed. The outer peripheries of a lamination structure including the tunneling insulating film 5, gate insulating film 7 and control gate electrode 8 on the sides of the source and drain regions 2 and 3 are disposed so that they become in contact with, or partially overlap, the edges of the source and drain regions 2 and 3 as viewed along the substrate normal direction.

While a voltage is not applied to the control gate electrode 8, a surface layer of the channel region 4 is depleted. A depletion layer is also formed at the interface between the $p^-$-type silicon substrate 1 and source region 2 and at the interface between the $p^-$-type silicon substrate 1 and drain region 3.

Next, the operation principle of the semiconductor memory of the first embodiment shown in FIG. 1 will be described with reference to FIGS. 2A to 2D.

Figure 2A:
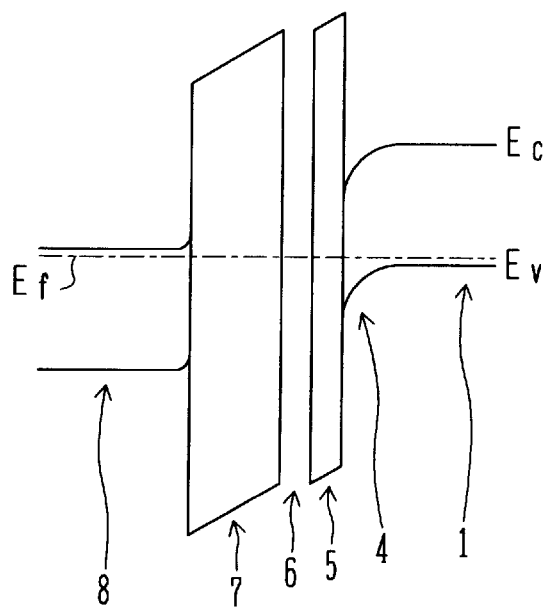
FIGS. 2A to 2D are energy band diagrams illustrating the operation principle of the semiconductor memory of the first embodiment.

FIG. 2A is an energy band diagram of the memory while a voltage is not applied to the control gate electrode 8. The band edge of the channel region 4 curves downward, and the surface layer of the channel region 4 is depleted. A Fermi level Ef of the floating gate electrode 6 is positioned between the lower edge Ec of the conduction band and the upper edge Ev of the valence band, respectively, of the channel region 4, i.e., positioned in the energy band gap.

Figure 2B:
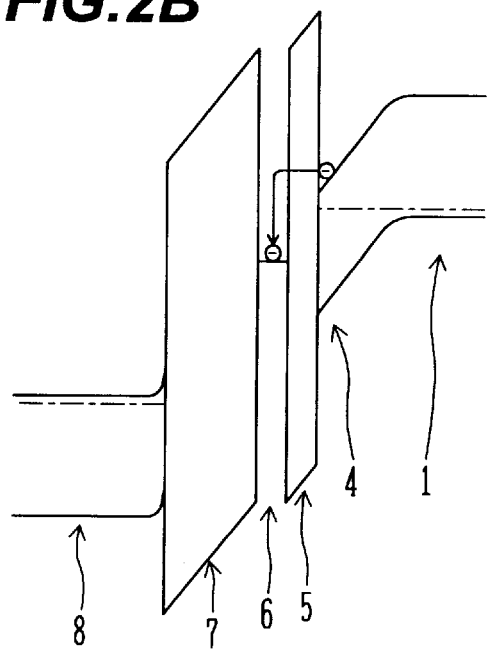

FIG. 2B is an energy band diagram during data write. A positive voltage relative to the source/drain regions is applied to the control gate electrode 8. For example, a voltage of +5 V is applied to the control gate electrode 8. A potential difference of about 1.5 V is generated between the floating gate electrode 6 and channel region 4. This potential difference forms an inversion layer in the surface layer of the channel region 4. Electrons in the inversion layer are injected into the floating gate electrode 6 by the tunneling phenomenon. The injected electrons have an energy level near at the Fermi level of the floating gate electrode 6.

Figure 2C:
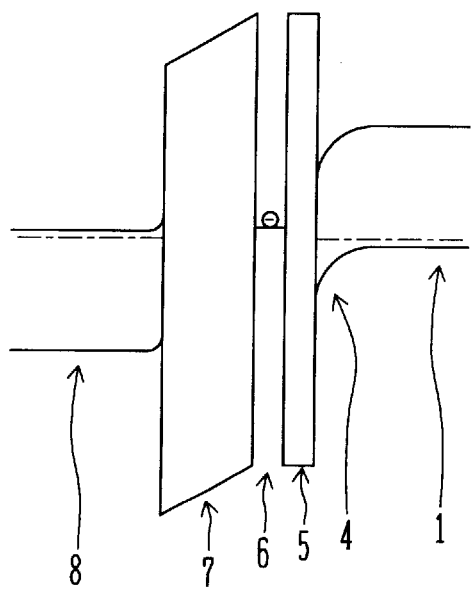

FIG. 2C is an energy band diagram in a data retention state. Since electrons are accumulated in the floating gate electrode 6, the electric potential of the floating gate electrode 6 lowers more than the state shown in FIG. 2A. Therefore, the band edge of the surface of the channel region 4 curves less than the state shown in FIG. 2A. The threshold value of the floating gate type FET is higher in the state shown in FIG. 2C than in the state shown in FIG. 2A. By detecting a difference between these two threshold values, stored data can be read.

In the state shown in FIG. 2C, the Fermi level of the floating gate electrode 6 is positioned in the energy band gap of the channel region 4. Therefore, the electrons having the energy level near the Fermi level will not enter the channel region 4 by the tunneling phenomenon. Holes hardly exist in the surface layer of the channel region 4 so that holes will not be injected from the channel region 4 into the floating gate electrode 6.

Referring to FIG. 1, opposite ends of the floating gate electrode 6 and the source/drain regions 2 and 3 are disposed to have a sufficient distance for inhibiting carriers from tunneling into the floating gate electrode 6. Therefore, the electrons accumulated in the floating gate electrode 6 will not enter the source/drain regions 2 and 3 by the tunneling phenomenon. Electrons in the floating gate electrode 6 can therefore be retained therein for a long time. It is therefore necessary to set each of the distances between both ends of the floating gate electrode 6 and the source/drain regions 2 and 3 longer than the thickness of the tunneling insulating film 5.

Figure 2D:
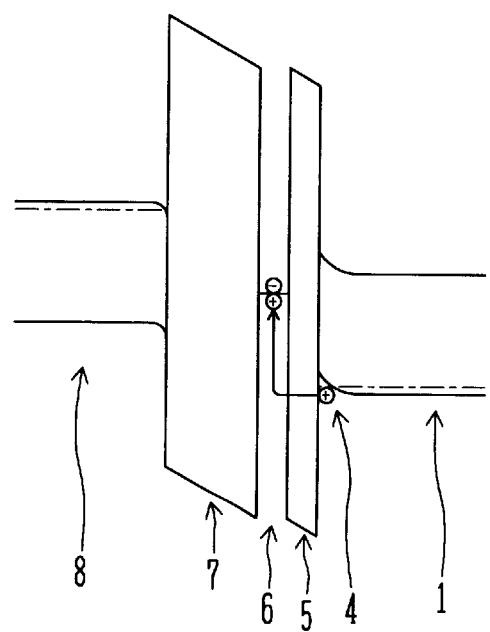

FIG. 2D is an energy band diagram during data erase. A negative voltage relative to the source/drain regions 2 and 3 is applied to the control gate electrode 8. For example, 0 V is applied to the source/drain regions and −5 V is applied to the control gate electrode 8. An accumulation layer is formed in the surface layer of the channel region 4. Holes in this accumulation layer are injected into the floating gate electrode 6 by the tunneling phenomenon. As the holes are injected, charges accumulated in the floating gate electrode 6 are neutralized. When the voltage is not applied to the control gate electrode 8, the state shown in FIG. 2A resumes.

During the data write shown in FIG. 2B and the data erase shown in FIG. 2D, carriers directly tunnel through the tunneling insulating film 5. Since the FN tunneling phenomenon is not incorporated, data write and data erase can be performed at a relatively low voltage.

Next, a method of manufacturing the semiconductor memory shown in FIG. 1 will be described. An element isolation structure is formed on the surface of the $p^-$-type silicon substrate 1 to define active regions. The surface of the active region is thermally oxidized to form the tunneling insulating film 5. A TiN film is deposited on the tunneling insulating film 5 and patterned to form the floating gate electrode 6. The TiN film may be deposited by reactive sputtering or chemical vapor deposition (CVD).

The gate insulating film 7 of $SiO_2$ is deposited by CVD on the tunneling insulating film 5 and floating gate electrode 6. The control gate electrode 8 of $n^+$-type polysilicon is deposited by CVD on the gate insulating film 7. The lamination structure from the control gate electrode 8 to the tunneling insulating film 5 is patterned to form a mesa structure from the tunneling insulating film 5 to the control gate electrode 8, as shown in FIG. 1.

By using this mesa structure as a mask, phosphorous ions are implanted to form the source/drain regions 2 and 3. With the above processes, the floating gate type FET shown in FIG. 1 can be manufactured.

In the first embodiment, the floating gate electrode 6 is made of refractory metal. Next, a modification of the first embodiment will be described, in which the floating gate electrode 6 is made of p-type Ge. Instead of p-type Ge, p-type SiGe may also be used. The structure of the semiconductor memory is similar to the first embodiment shown in FIG. 1.

A Ge film may be deposited by low pressure CVD using $GeH_4$. An SiGe film may be deposited by using $SiH_4$ and $GeH_4$. In order to provide a p-type conductivity, boron ions may be implanted after the film is formed, or a gas of $B_2H_6$ may be introduced during the film formation process. These film forming processes are described, for example, in IEEE Electron Device Letters, Vol. 18, No. 9, September 1997, pp. 456–458.

Figure 3A:
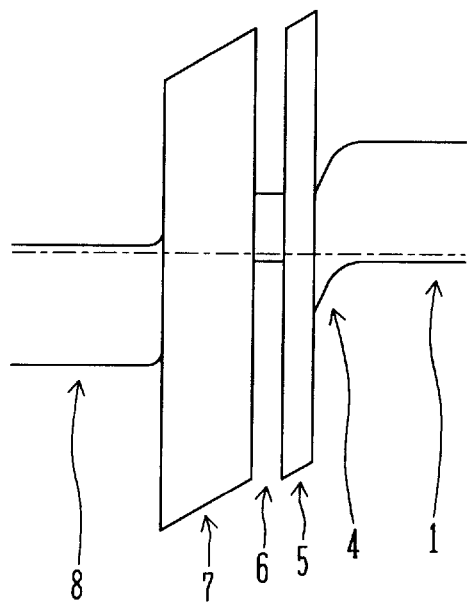
FIGS. 3A to 3D are energy band diagrams illustrating the operation principle of a semiconductor memory according to a modification of the first embodiment.

FIG. 3A is an energy band diagram while a voltage is not applied. The energy level at the upper edge of the valence band of Ge is higher by about 0.5 eV than the energy level at the upper edge of the valance band of Si. The Fermi level of p-type Ge is therefore positioned nearly at the center of the energy band gap of the channel region 4.

Figure 3B:
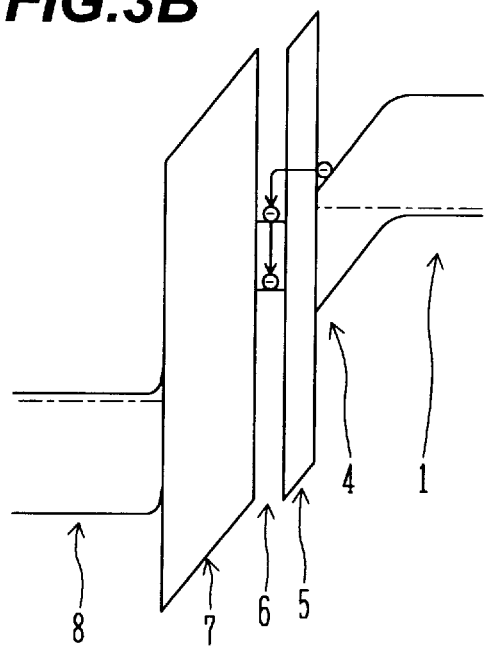

FIG. 3B is an energy band diagram during the data write. Similar to the state shown in FIG. 2B, a positive voltage relative to the source/drain regions is applied to the control gate electrode 8. Electrons are injected from the channel region 4 into the floating gate electrode 6. The injected electrons have an energy level near at the Fermi level, i.e., an energy level near at the upper edge of the valance band.

Figure 3C:
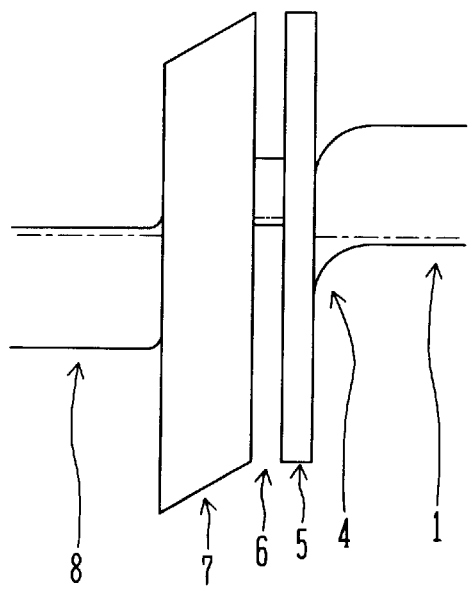

FIG. 3C is an energy band diagram in the data retention state. Since electrons are accumulated in the floating gate electrode 6, the potential of the floating gate electrode 6 becomes lower than that in the state shown in FIG. 3A. Similar to the state shown in FIG. 2C, the threshold voltage of the floating gate FET changes.

The electrons injected into the floating gate electrode 6 have the energy level near at the upper edge of the valence band. Since this energy level is positioned in the energy band gap of the channel region 4, the electrons will not enter the channel region 4. Similar to the state shown in FIG. 2C, the electrons are therefore retained in the floating gate electrode 6.

Figure 3D:
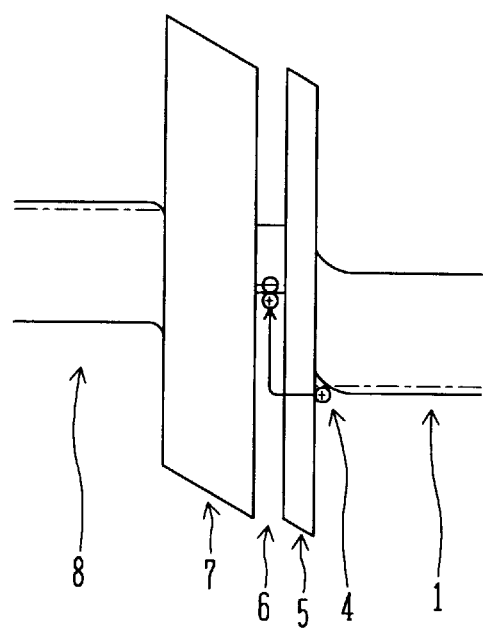

FIG. 3D is an energy band diagram during the data erase. A negative voltage relative to the source/drain regions is applied to the control gate electrode 8. Similar to the state shown in FIG. 2D, holes are injected from the channel region 4 into the floating gate electrode 6 so that negative charges in the floating gate electrode 6 are neutralized.

As described above, similar to the first embodiment, the function of the semiconductor memory can be realized by using p-type Ge as the material of the floating gate electrode 6. The function of the semiconductor memory can also be realized by using p-type SiGe as the material of the floating gate electrode 6.

In the first embodiment and its modification, data is maintained by retaining electrons injected into the floating gate electrode 6. In order to prolong an electron retention time, it is desired that the Fermi level of the floating gate electrode 6 be positioned in the energy band gap of the surface of the channel region 4, in the states shown in FIGS. 2C and 3C. It is also desired that the materials of the channel region 4, floating gate electrode 6 and control gate 8 be selected so that the following formulas are satisfied:

$$(Ec-Efo) \geq 0.4 \text{ eV and } (Efo-Ev) \geq 0.4 \text{ eV}$$

where Efo is the Fermi level of the floating gate electrode 6 while no voltage is applied, Ec is the energy level at the lower edge of the conduction band of n the surface of the channel region 4, and Ev is the energy level at the upper edge of the valance band. If a difference between Ec and Efo and a difference between Efo and Ev are both 0.4 eV or larger, this energy difference functions as a sufficient potential barrier for carriers having a heat energy at the room temperature (300 K).

It is not preferable to use, as the material of the floating gate electrode 6, semiconductor material such as intrinsic silicon whose Fermi level is positioned nearly at the center of the energy band gap. It is preferable to use the material such as p-type Ge used by the modification of the first embodiment so that the energy level of electrons can have a level near at the Fermi level. Carriers having the heat energy at the room temperature exist at the energy level of Efo+50 meV at a sufficiently large probability. It is therefore preferable to select, as the material of the floating gate electrode 6, the material allowing electrons to have the energy level in the range of Efo±50 meV.

Next, the semiconductor memory according to the second embodiment will be described with reference to FIG. 4 and FIGS. 5A to 5D. In the first embodiment, the floating gate electrode 6 is made of refractory metal, p-type Ge or p-type SiGe. In the second embodiment, the floating gate electrode 6 is made of n-type polysilicon.

Figure 4:
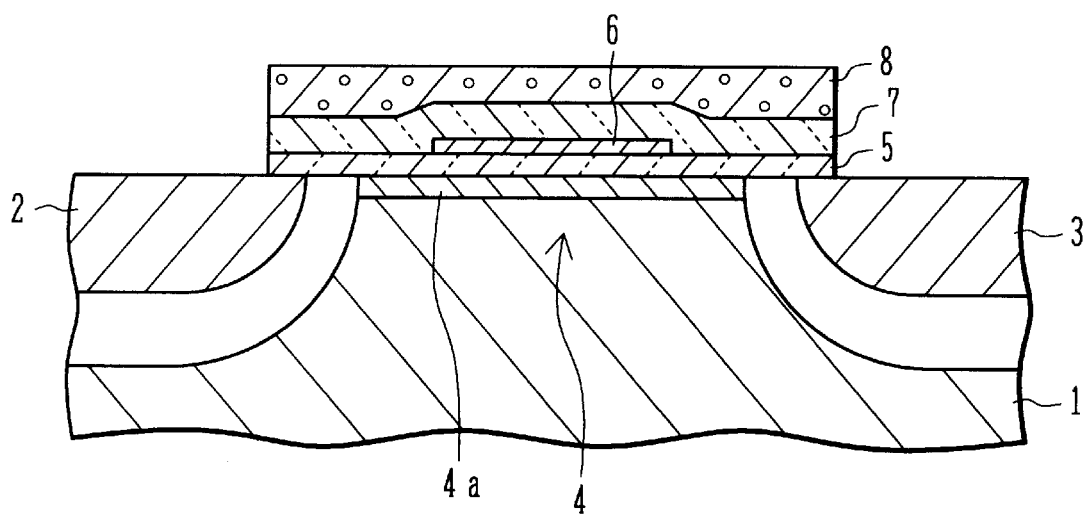
FIG. 4 is a cross sectional view of one memory cell of a semiconductor memory according to a second embodiment of the invention.

FIG. 4 is a cross sectional view of one memory cell of the semiconductor memory according to the second embodiment. The fundamental structure is similar to that of the semiconductor memory of the first embodiment shown in FIG. 1 so that only different points will be described. Constituents of the semiconductor memory shown in FIG. 4 similar to those shown in FIG. 1 are represented by using identical reference numerals.

In the second embodiment, the impurity concentration of the surface layer 4a of the channel region 4 is set higher than the impurity concentration of the substrate deeper layer. For example, the impurity concentration of the surface layer 4a is $1 \times 10^{18}$ cm$^{-3}$ or higher. The floating gate electrode 6 is made of n-type polysilicon doped with phosphorous. For example, the impurity concentration of the floating gate electrode 6 is $1 \times 10^{20}$ cm$^{-3}$.

The surface layer 4a is formed by implanting, for example, boron ions prior to forming the tunneling insulating film 5. The polysilicon film may be deposited by CVD using $SiH_4$.

Next, the operation principle of the semiconductor memory of the second embodiment will be described with reference to FIGS. 5A to 5D.

Figure 5A:
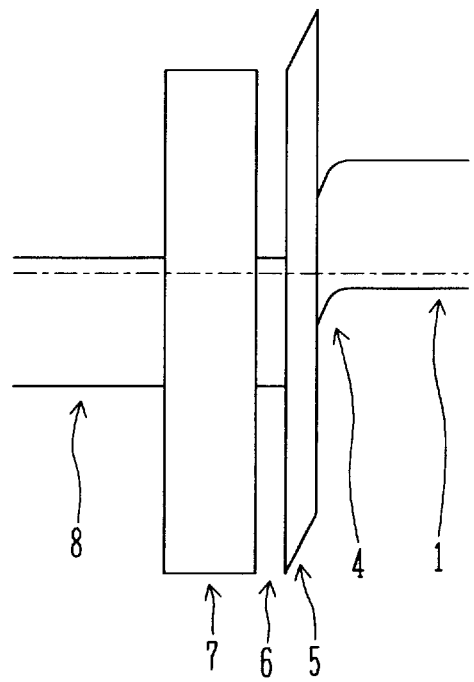
FIGS. 5A to 5D are energy band diagrams illustrating the operation principle of the semiconductor memory of the second embodiment.

FIG. 5A is an energy band diagram of the memory while a voltage is not applied to the control gate electrode 8. The band edge curves downward near the surface of the channel region 4. A Fermi level of the floating gate electrode 6 is positioned in the energy band gap of the channel region 4.

Figure 5B:
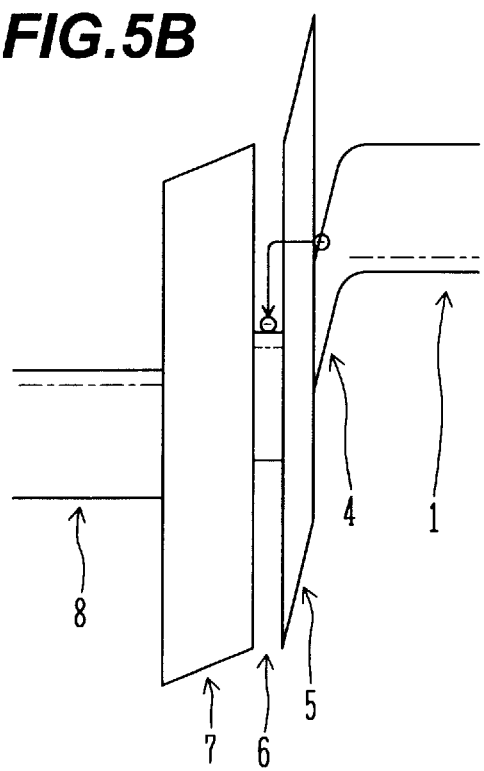

FIG. 5B is an energy band diagram during the data write. A positive voltage relative to the source/drain regions 2 and 3 is applied to the control gate electrode 8. An inversion layer is formed in the surface layer of the channel region 4. Electrons in the inversion layer are injected into the floating gate electrode 6 by the tunneling phenomenon. The injected electrons have an energy level near at the Fermi level, i.e., an energy level near at the lower edge of the conduction band.

Figure 5C:
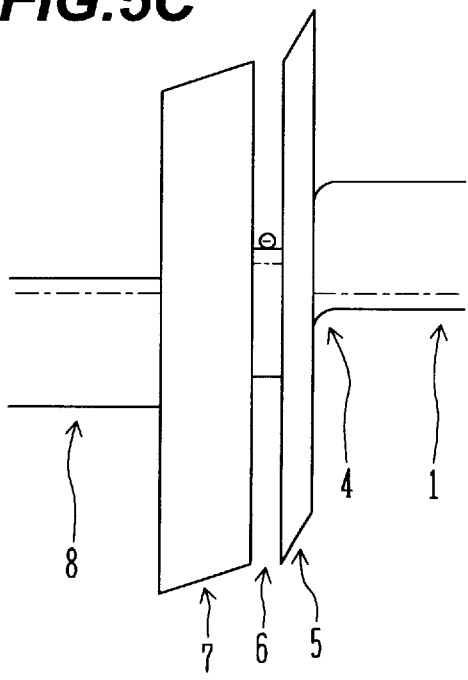

FIG. 5C is an energy band diagram in the data retention state. Since negative charges are accumulated in the floating gate electrode 6, the potential of the floating gate electrode 6 lowers. Therefore, the band edge of the surface of the channel region 4 curves less than the state shown in FIG. 5A. The threshold value of the floating gate type FET is higher in the state shown in FIG. 5C than in the state shown in FIG. 5A.

The Fermi level of the floating gate electrode 6 is positioned in the energy band gap of the channel region 4. Further, since the impurity concentration of the surface layer of the channel region 4 is set high, most of the potential difference between the channel region 4 and floating gate electrode 6 is applied to the tunneling insulating film 5.

Since a large potential difference is applied across the tunneling insulating film 5, the surface of the channel region 4 has no energy level corresponding to the energy level of electrons excessively accumulated at the lower edge of the conduction band of the floating gate electrode 6. Therefore, the electrons injected into the floating gate electrode 6 will not enter the channel region 4 by the tunneling phenomenon. Since the electrons will not enter the channel region 4, it is possible to retain the electrons injected into the floating gate electrode 6 for a long time.

Figure 6:
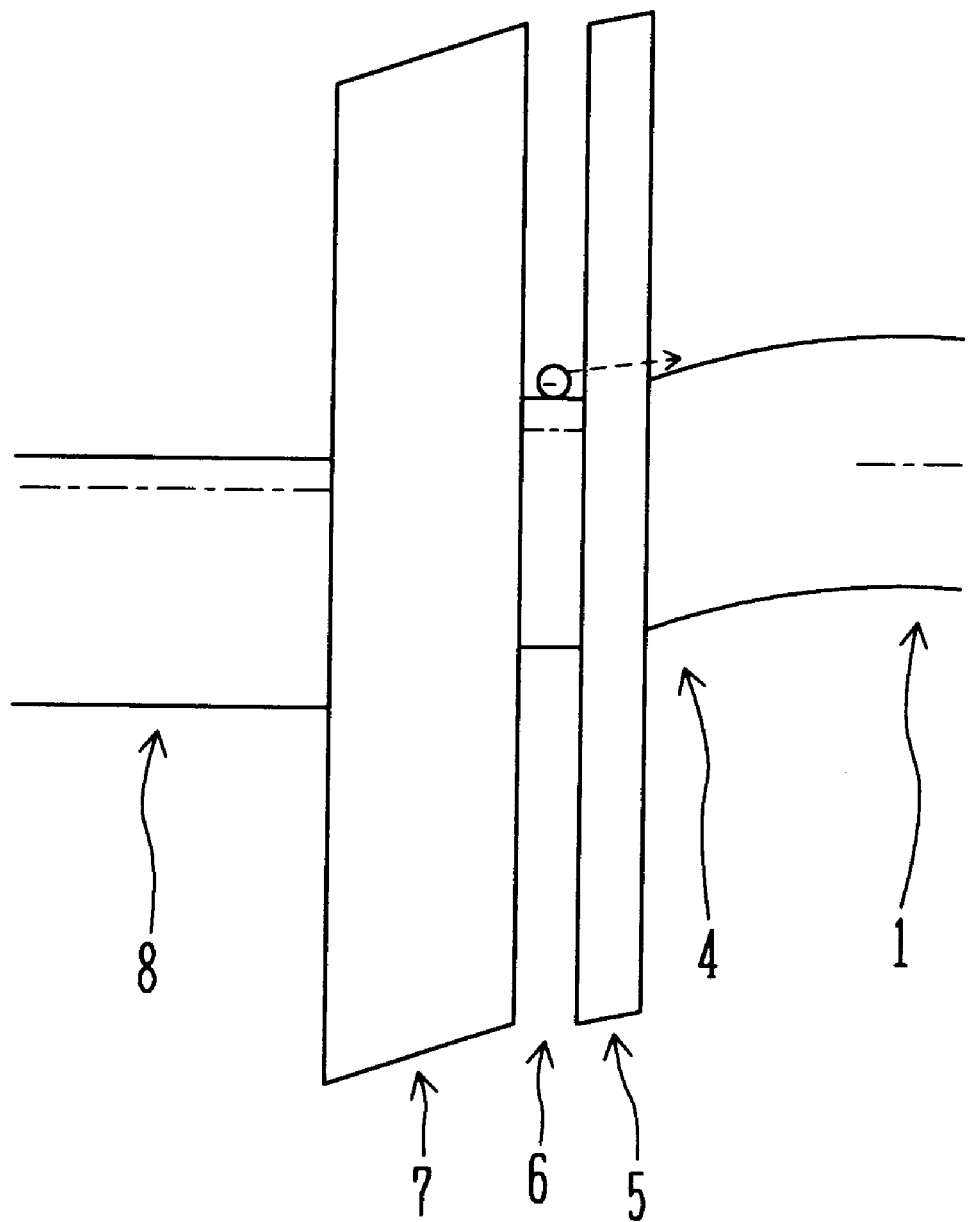
FIG. 6 is an energy band diagram showing a data retention state of the semiconductor memory of the second embodiment, wherein the impurity concentration of the channel region is set low.

FIG. 6 is an energy band diagram in the data retention state wherein the impurity concentration of the surface layer of the channel region 4 is not set higher than that of the deeper layer. Since the impurity concentration of the channel region 4 is relatively low, the potential difference between the floating gate electrode 6 and channel region 4 is extends down to the deeper layer of the channel region 4.

Since a voltage to be applied across the tunneling insulating film 5 becomes small, the lower edge of the conduction band of the channel region 4 is positioned slightly higher than the lower edge of the conduction band of the floating gate electrode 6. Therefore, electrons excessively accumulated near at the lower edge of the conduction band of the floating gate electrode 6 become likely to enter the channel region 4 by the tunneling phenomenon. As the electrons accumulated in the floating gate electrode 6 enter the channel region 4, the stored data is erased.

Data can be retained for a long time by setting the impurity concentration of the surface layer of the channel region 4 higher than that of the deeper layer. If the impurity concentration of the substrate is set high, a large voltage can be applied across the tunneling insulating film 5 as shown in FIG. 5C. However, a high impurity concentration of the substrate is not preferable because the high impurity concentration becomes a cause of increasing leak current between the substrate and the source/drain regions 2 and 3.

Figure 5D:
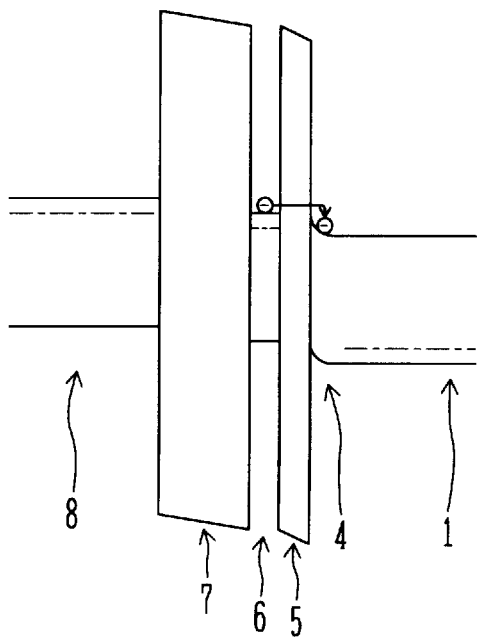

FIG. 5D is an energy band diagram during the data erase. A negative voltage relative to the source/drain regions 2 and 3 is applied to the control gate electrode 8. In the first embodiment shown in FIG. 2D and in the modification of the first embodiment shown in FIG. 3D, charges are neutralized by injecting holes from the channel region 4 into the floating gate electrode 6. In the state shown in FIG. 5C of the second embodiment, the energy level at the upper edge of the valence band of the channel region 4 is positioned in the energy band gap of the floating gate electrode 6.

Therefore, if only a small negative voltage is applied to the floating gate electrode 6, it is impossible to inject holes from the channel region 4 into the floating gate electrode 6. As the negative voltage to be applied to the floating gate electrode 6 is made high and when the energy levels at the upper edges of the valence bands of the channel region 4 and floating gate electrode 6 become generally equal, hole injection starts. At this time, however, the energy levels at the lower edges of the conduction bands of the channel region 4 and floating gate electrode 6 also become generally equal. Therefore, electrons excessively accumulated in the floating gate electrode 6 enter the channel region 4 by the tunneling phenomenon.

The motion of electrons into the channel region 4 becomes dominant over the injection of holes into the floating gate electrode 6. Data is therefore erased by the motion of electrons from the floating gate electrode 6 into the channel region 4.

In the second embodiment, polysilicon is used as the material of the floating gate electrode 6. The floating gate electrode 6 can therefore be formed by a general silicon process used for the manufacture of dynamic random access memories (DRAMs).

Figure 7:
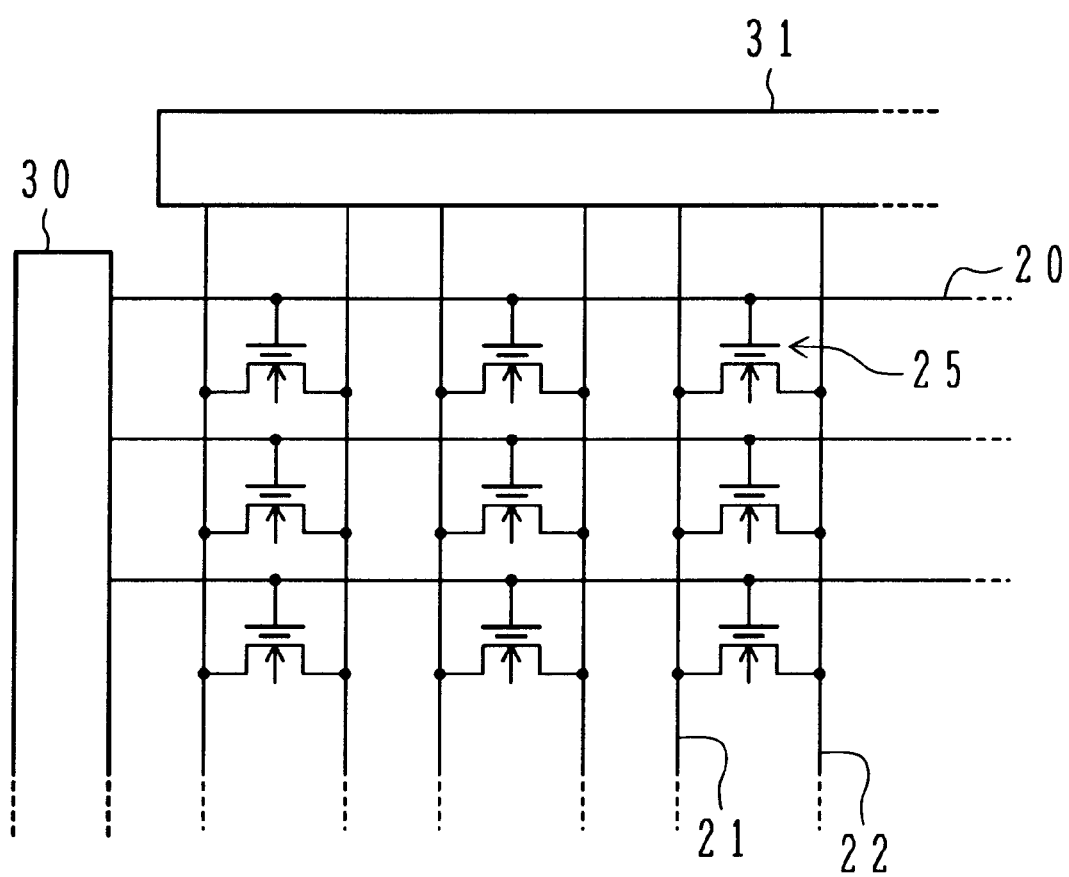
FIG. 7 is an equivalent circuit of the semiconductor memory according to the first and second embodiments of the invention.

FIG. 7 is an equivalent circuit of a semiconductor memory of the first and second embodiments. A plurality of gate lines 20 disposed in parallel extend in the horizontal direction of FIG. 7. A plurality of source lines 21 and drain lines 22 disposed in parallel extend in the vertical direction of FIG. 7. The source and drain lines 21 and 22 are alternately disposed.

A floating gate type FET 25 is disposed at a cross point between a pair of source and drain lines 21 and 22 and one gate line 20. The control gate electrode, source region and drain region of the floating gate type FET 25 are connected to corresponding gate line 20, source line 21 and drain line 22. All of the gate lines 20 are connected to a gate line controller 30, and all of the source and drain lines 21 and 22 are connected to a source/drain line controller 31.

A method of writing data in one memory cell will be described. A voltage of 0 V is applied to the source and drain lines 21 and 22 corresponding to a memory cell in which data is to be written, and a voltage ($+V_{write}$) is applied to the corresponding gate line 20. The source and drain lines 21 and 22 not selected are applied with the voltage ($+V_{write}$), and the gate lines 20 not selected are applied with the voltage of 0 V. These voltages are applied under the control of the gate line controller 30 and source/drain line controller 31.

Data is written in the selected memory cell by applying a voltage $V_{write}$ between the control gate electrode and channel region. In the memory cell not selected, a p-n junction between the source/drain regions and channel region is reversely biased. Therefore, an electric field is concentrated upon an area between the opposite ends of the control gate electrode 8 shown in FIG. 1 and the ends of the source/drain regions 2 and 3, and a large voltage is not applied between the floating gate electrode 7 and channel region 4. Therefore, data is not written in the memory cells not selected.

In erasing the stored data, a voltage ($-V_{write}$) is applied to the gate line 20. Data in the memory cells connected to the gate line 20 applied with the voltage ($-V_{write}$) is all erased.

Next, a method of reading data will be described. A voltage $+V_{read}$ is applied to the gate line 20 of the memory cell from which data is to be read. The voltage $+V_{read}$ has a middle value between the threshold value during the data erase state and the threshold value during the data write state. The other gate lines 20 are applied with a voltage of 0 V to make all memory cells non-conductive. A voltage is applied between the source and drain lines 21 and 22 of the memory cell from which data is to be read, and current flowing between the source and drain lines 21 and 22 is detected. Current flows if data is being written in the memory cell, whereas current hardly flows if data was erased.

In the semiconductor memory of the above embodiments, one memory cell is constituted of only one floating gate type FET. High integration of memory cells is therefore possible.

In the above embodiments, a p⁻-type silicon substrate and an n-channel floating gate type FET are used. Instead, an n-type silicon substrate and a p-channel floating gate type FET may also be used. In this case, the polarity of the voltage to be applied between the source/drain regions 2 and 3 and the control gate electrode 8 is reversed. In the second embodiment, the floating gate electrode 6 is made of p-type polysilicon. It is preferable that the conductivity type of the control gate electrode 8 is the same as that of the substrate.

The present invention has been described in connection with the preferred embodiments. The invention is not limited only to the above embodiments. It is apparent that various modifications, improvements, combinations, and the like can be made by those skilled in the art.

What is claimed is:

1. A semiconductor memory comprising:
   a semiconductor substrate;
   a source region and a drain region formed in a surface layer of said semiconductor substrate on both sides of a channel region defined in the surface layer, said source and drain regions being of a first conductivity type;
   a tunneling insulating film formed on the channel region of said semiconductor substrate, said tunneling insulating film having a thickness which allows carriers to tunnel therethrough by a tunneling phenomenon;

a floating gate electrode formed on said tunneling insulating film, said floating gate electrode being disposed so as to overlap neither said source region nor said drain region as viewed along a substrate normal direction;

a gate insulating film formed over the channel region and covering said floating gate electrode; and a control gate electrode formed on said gate insulating film, said control gate electrode being disposed so as to become in contact with, or partially overlap, said source and drain regions as viewed along the substrate normal direction, wherein materials of said floating gate electrode and the channel region are selected so that a Fermi level of said floating gate electrode is positioned inside an energy band gap of the channel region when an external voltage is not applied between the channel region and said control gate electrode.

2. A semiconductor memory according to claim 1, wherein the channel region is made of silicon having a second conductivity type opposite to the first conductivity type.

3. A semiconductor memory according to claim 2, wherein said floating gate electrode is made of refractory metal.

4. A semiconductor memory according to claim 2, wherein said floating gate electrode is made of p-type impurity doped germanium or p-type impurity doped silicon germanium.

5. A semiconductor memory according to claim 2, wherein said floating gate electrode is made of silicon doped with impurities of the first conductivity type.

6. A semiconductor memory according to claim 5, wherein an impurity concentration of a surface layer of the channel region is set higher than an impurity concentration of a deeper layer of the channel region.

7. A semiconductor memory according to claim 1, wherein a distance between said floating gate electrode and said source region and a distance between said floating gate electrode and said drain region are both set to a distance which inhibits carriers from moving therebetween by the tunneling phenomenon.

8. A semiconductor memory according to claim 1, wherein a distance between said floating gate electrode and said source region and a distance between said floating gate electrode and said drain region are both longer than a thickness of said tunneling insulating film.

9. A semiconductor memory according to claim 1, wherein $Ec-Efo$ is at least 0.4 eV and $Efo-Ev$ is at least 0.4 eV where $Efo$ is the Fermi level of said floating gate electrode, $Ec$ is an energy level at a lower edge of a conduction band of a surface of the channel region, and $Ev$ is an energy level at an upper edge of a valence band of a surface of the channel region.

10. A semiconductor memory comprising:

a plurality of memory cells disposed in a matrix form on said semiconductor substrate, each memory cell being made of one FET including a source region, a drain region, a channel region defined between said source and drain regions, a floating gate electrode disposed above the channel region, a tunneling insulating film disposed between said channel region and said floating gate electrode, a control gate electrode disposed above said floating gate electrode, and a gate insulating film disposed between said floating gate electrode and said control gate electrode, said floating gate electrode being disposed so as to overlap neither said source region nor said drain region as viewed along the substrate normal direction;

gate lines arranged at every rows of said plurality of memory cells, each gate line connecting said control gate electrodes of a plurality of memory cells disposed on the same row;

source lines arranged at every columns of said plurality of memory cells, each source line connecting said source regions of a plurality of memory cells disposed on the same column;

drain lines arranged at every columns of said plurality of memory cells, each drain line connecting said drain regions of a plurality of memory cells disposed on the same column;

a gate line controller for selectively applying an electric signal to said gate line corresponding to one row; and a source/drain line controller for selectively applying an electric signal to said source and drain lines corresponding to one column.

11. A semiconductor memory according to claim 10, wherein said gate line controller and said source/drain line controller selectively apply voltages to said gate line, source line and drain line so that in a memory cell at a cross point between selected row and column, electrons tunnel from said channel region into said floating gate electrode to change the relevant memory cell into a data write state, and in other memory cells, electrons will not tunnel into said floating gate electrodes.

12. A semiconductor memory according to claim 11, wherein said gate line controller applies a voltage to all of said gate lines to erase data in all of said memory cells, the voltage having a value sufficient for making electrons accumulated in said floating gate electrodes of said memory cells in a data write state tunnel into the channel region or making holes in the channel regions tunnel into said floating gate electrodes to change all memory cells into a data erase state.

13. A semiconductor memory according to claim 12, wherein said gate line controller applies a voltage to said gate line, the voltage having a middle voltage between a threshold voltage of said memory cell in the data write state and a threshold voltage of said memory cell in the data erase state.

* * * * *